(12) United States Patent
Lees et al.

(10) Patent No.: US 11,309,140 B2
(45) Date of Patent: Apr. 19, 2022

(54) CONTACT SWITCH COATING

(71) Applicant: Littelfuse, Inc., Chicago, IL (US)

(72) Inventors: Philip Warner Lees, North Attleboro, MA (US); Joshua James Koeppel, Lake Mills, WI (US); J. Anthony Spies, Lake Mills, WI (US); Eric James Hafenstein, Lake Mills, WI (US)

(73) Assignee: Littelfuse, Inc., Chicago, IL (US)

( * ) Notice: Subject to any disclaimer, the term of this patent is extended or adjusted under 35 U.S.C. 154(b) by 484 days.

(21) Appl. No.: 16/240,325

(22) Filed: Jan. 4, 2019

(65) Prior Publication Data
US 2020/0219670 A1 Jul. 9, 2020

(51) Int. Cl.
| | |
|---|---|
| *H01H 1/66* | (2006.01) |
| *H01H 1/02* | (2006.01) |
| *C23C 14/16* | (2006.01) |
| *H01H 1/58* | (2006.01) |
| *H01H 36/00* | (2006.01) |

(52) U.S. Cl.
CPC ......... *H01H 1/0201* (2013.01); *C23C 14/165* (2013.01); *H01H 1/5822* (2013.01); *H01H 36/0006* (2013.01)

(58) Field of Classification Search
CPC ............... H01H 1/0201; H01H 1/5822; H01H 36/0006; C23C 14/165
USPC ....................................................... 335/151
See application file for complete search history.

(56) References Cited

U.S. PATENT DOCUMENTS

| | | | | | |
|---|---|---|---|---|---|
| 1,882,614 | A | * | 10/1932 | Hunciker | H01H 29/16 335/205 |
| 2,492,875 | A | * | 12/1949 | McCabe | H01H 29/16 200/235 |
| 2,797,329 | A | * | 6/1957 | George | H01H 29/006 331/78 |
| 2,898,422 | A | * | 8/1959 | Peek, Jr. | H01H 51/28 335/83 |
| 2,925,646 | A | * | 2/1960 | Walsh | H01H 51/28 29/602.1 |

(Continued)

FOREIGN PATENT DOCUMENTS

| | | |
|---|---|---|
| DE | 2541925 A1 | 4/1976 |
| GB | 1220840 A | 1/1971 |

OTHER PUBLICATIONS

Extended European Search Report dated Apr. 7, 2020 for EPO Application No. 19218726.8.

*Primary Examiner* — Shawki S Ismail
*Assistant Examiner* — Lisa N Homza
(74) *Attorney, Agent, or Firm* — Kacvinsky Daisak Bluni PLLC

(57) ABSTRACT

Switch assemblies and switching methods are disclosed. In some embodiments, a switch assembly may include a first blade having a first contact within an enclosed cavity, and a second blade having a second contact within the enclosed cavity. The first and second contacts are operable to make or break contact with one another in response to a magnetic field. The switch assembly may further include a coating formed over each of the first and second contacts, the coating including a titanium layer, a second layer formed over the titanium layer, and a tungsten-copper layer formed over the second layer. In some embodiments, the second layer is copper or molybdenum.

10 Claims, 3 Drawing Sheets

(56) References Cited

U.S. PATENT DOCUMENTS

| | | | | |
|---|---|---|---|---|
| 3,018,354 A | * | 1/1962 | Pollard, Jr. | H01H 1/08 200/244 |
| 3,056,868 A | * | 10/1962 | Jacobson | H01H 51/284 335/153 |
| 3,116,384 A | * | 12/1963 | William | H01H 51/28 335/58 |
| 3,167,625 A | * | 1/1965 | Russo | H01H 51/281 335/154 |
| 3,174,008 A | * | 3/1965 | Mishelevich | H01H 51/281 335/154 |
| 3,188,426 A | * | 6/1965 | Wessel | H01H 1/0201 335/154 |
| 3,196,232 A | * | 7/1965 | Lisuzzo | H01H 51/281 335/154 |
| 3,215,795 A | * | 11/1965 | Matthias | H01H 67/24 335/153 |
| RE25,988 E | * | 3/1966 | Dal Bianco et al. | H01H 37/585 335/154 |
| 3,239,626 A | * | 3/1966 | Pearse | H01H 51/281 335/153 |
| 3,239,628 A | * | 3/1966 | Lesser | H01H 50/54 335/128 |
| 3,249,824 A | * | 5/1966 | Pearse | H01H 51/282 335/284 |
| 3,251,121 A | * | 5/1966 | Prival | C23C 10/28 29/879 |
| 3,261,941 A | * | 7/1966 | Shlesinger, Jr. | H01H 36/0073 335/205 |
| 3,261,957 A | * | 7/1966 | Theobald | H01H 1/0201 200/246 |
| 3,270,161 A | * | 8/1966 | Turner | H01H 51/287 335/151 |
| 3,314,029 A | * | 4/1967 | Matthias | H01H 47/16 335/151 |
| 3,320,559 A | * | 5/1967 | Morrison | H01H 51/281 335/151 |
| 3,345,593 A | * | 10/1967 | Grengg | H01H 51/287 335/154 |
| 3,348,175 A | * | 10/1967 | Wilkis | H01H 51/287 335/154 |
| 3,349,352 A | * | 10/1967 | Zandt | H01H 51/287 335/154 |
| 3,426,302 A | * | 2/1969 | Lindenberger | H01H 51/282 335/154 |
| 3,439,303 A | * | 4/1969 | Purzycki | H01H 51/281 335/154 |
| 3,533,026 A | * | 10/1970 | Klock | H01H 36/008 335/179 |
| 3,541,482 A | * | 11/1970 | Brown | H01H 51/287 335/154 |
| 3,541,483 A | * | 11/1970 | Hara | B32B 27/00 335/154 |
| 3,559,205 A | * | 1/1971 | Colby | B60Q 1/40 340/575 |
| 3,579,158 A | * | 5/1971 | Kutyla | H01H 51/287 335/151 |
| 3,586,809 A | * | 6/1971 | Santi | H01H 1/04 200/263 |
| 3,651,297 A | * | 3/1972 | Jones | H01H 51/281 200/302.1 |
| 3,701,960 A | * | 10/1972 | Campbell | H01H 51/28 335/154 |
| 3,760,312 A | * | 9/1973 | Shlesinger, Jr. | H01H 36/0006 335/205 |
| 3,805,378 A | * | 4/1974 | Archer | H01H 1/0201 29/622 |
| 3,813,508 A | * | 5/1974 | Toshiki | H01H 1/0201 200/268 |
| 3,818,392 A | * | 6/1974 | Guichard | H01H 51/287 335/154 |
| RE28,220 E | * | 10/1974 | Ratliff et al. | H01H 51/28 335/154 |
| 3,952,271 A | * | 4/1976 | Smirnov | H01H 1/66 335/151 |
| 3,967,224 A | * | 6/1976 | Seeley | H01H 36/0026 335/151 |
| 4,011,533 A | * | 3/1977 | Santi | H01H 1/50 335/154 |
| 4,019,163 A | * | 4/1977 | Beavitt | H01H 1/66 335/154 |
| 4,063,203 A | * | 12/1977 | Fujiwara | H01H 1/66 335/154 |
| 4,083,025 A | * | 4/1978 | Meuller | H01H 51/281 335/151 |
| 4,092,586 A | * | 5/1978 | Dinkier | G01K 15/00 324/203 |
| 4,121,184 A | * | 10/1978 | Dinkier | H01H 37/585 335/146 |
| 4,129,765 A | * | 12/1978 | Herklotz | H01H 1/0201 200/268 |
| 4,134,088 A | * | 1/1979 | Asbell | H01H 51/281 335/51 |
| 4,149,130 A | * | 4/1979 | Lacis | H01H 51/287 335/154 |
| 4,188,601 A | * | 2/1980 | Wiese | H01H 1/08 335/51 |
| 4,661,791 A | * | 4/1987 | Wakasugi | H01H 1/66 218/138 |
| 4,804,932 A | * | 2/1989 | Akanuma | H01H 1/08 335/38 |
| 4,943,791 A | * | 7/1990 | Holce | H01H 36/0026 335/151 |
| 5,252,936 A | * | 10/1993 | Norimatsu | H01H 51/281 335/151 |
| 5,457,293 A | * | 10/1995 | Breed | H01H 35/147 200/61.52 |
| 5,847,632 A | * | 12/1998 | Oshima | H01H 1/66 335/151 |
| 5,883,556 A | * | 3/1999 | Shutes | H01H 1/66 335/57 |
| 6,271,740 B1 | * | 8/2001 | Chikamatsu | H01H 51/28 335/151 |
| 6,292,074 B1 | * | 9/2001 | Amano | B60T 17/225 335/151 |
| 7,564,330 B2 | | 7/2009 | Pickhard et al. | |
| 2005/0077989 A1 | * | 4/2005 | Edmonson | H01H 36/0013 335/207 |
| 2005/0088264 A1 | * | 4/2005 | Iwasaki | H01H 51/281 335/151 |
| 2006/0181374 A1 | * | 8/2006 | Lee | H01H 36/0046 335/78 |
| 2008/0258852 A1 | * | 10/2008 | Pickhard | H01H 1/0201 335/154 |
| 2009/0184788 A1 | * | 7/2009 | Hernandez | H01H 29/06 335/205 |
| 2012/0182100 A1 | * | 7/2012 | Vuillermet | H01H 36/00 335/205 |
| 2016/0307719 A1 | | 10/2016 | Pickhard | |

* cited by examiner

CONTACT SWITCH COATING

BACKGROUND OF THE DISCLOSURE

Field of the Disclosure

This disclosure relates generally to the field of switches and, more particularly, to a coating for contact switches.

Discussion of Related Art

Reed switches are electromechanical switches having two reed blades formed of a conductive ferromagnetic material, typically a ferrous nickel alloy. In the presence of a magnetic field, the overlapping reed blades attract, causing the blades to bend towards each other and make contact, thus closing an electrical circuit. The two reed blades may be positioned within a glass capsule hermetically sealing the reed blades. The capsule typically contains a vacuum, air, or nitrogen at atmospheric or super atmospheric pressure. Reed switches can switch significant power, for example in the range of 10 to 100 Watts. Reed switches also have a long life measured in millions to over 100 million operations without failure or significant increase in contact resistance. Over many cycles the reed contacts can become worn, pitted, or eroded, due to mechanical wear or the electrical arcing as the switch opens and closes. This pitting or corrosion results in an increase in electrical resistance across the closed switch. To prevent, or at least minimize, such erosion, the contact surfaces of the reed blades may be coated with various materials having a hard, high melting temperature metal with relatively low resistivity. Recently the cost of certain plating materials, such as gold, rhodium and ruthenium, has dramatically increased. Therefore, what is needed is a reed switch contact arrangement, which minimizes the amount of these types of materials present on the contact faces of the reed blades without decreasing reed switch life.

SUMMARY OF THE DISCLOSURE

In one or more embodiments, a switch assembly may include a switch assembly including a first blade having a first contact within an enclosed cavity, and a second blade having a second contact within the enclosed cavity. The first and second contacts are operable to make or break contact with one another in response to a magnetic field. The switch assembly may further include a coating formed over each of the first and second contacts. The coating may include a titanium layer, a second layer formed over the titanium layer, a tungsten-copper layer formed over the second layer.

In one or more embodiments, a switching method may include providing a first contact operable with a second contact, wherein the first and second contacts form an open circuit in a first configuration and form a closed circuit in a second configuration. The switching method may further include providing a coating over each of the first and second contacts, the coating including a titanium layer, a second layer formed over the titanium layer, and a tungsten-copper layer formed over the second layer. The switching method may further include biasing the first contact and the second contact relative to one another using a magnetic field, wherein the magnetic field.

In one or more embodiments, a reed switch may include a first blade having a first contact within an enclosed cavity, a second blade having a second contact within the enclosed cavity, the first and second contacts operable to make or break contact with one another in response to a magnetic field. The reed switch may further include a coating formed over each of the first and second contacts, the coating including a titanium layer, a second layer formed over the titanium layer, and a tungsten-copper layer formed over the second layer.

BRIEF DESCRIPTION OF THE DRAWINGS

The accompanying drawings illustrate exemplary approaches of the disclosed switch assemblies so far devised for the practical application of the principles thereof, and in which.

Figure 1:
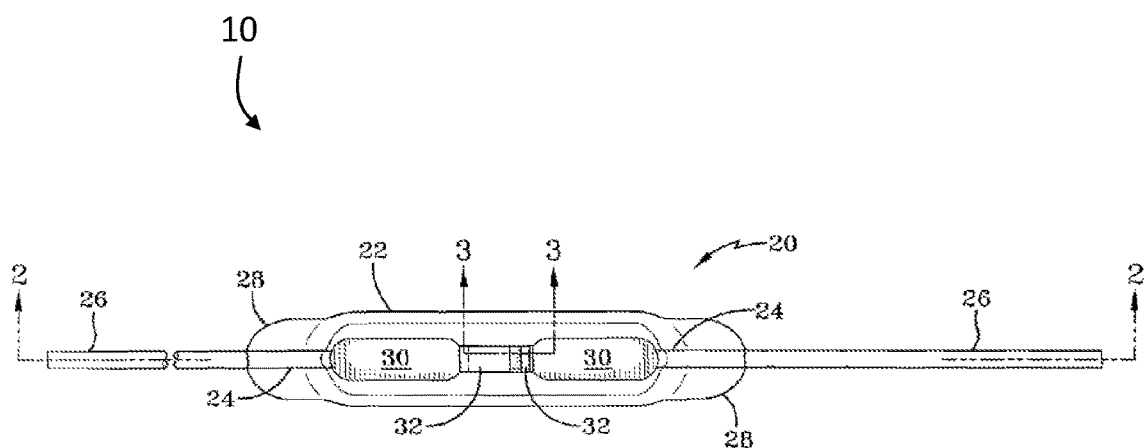
FIG. 1 is a top cross-sectional view of a reed switch employing the contact coating according to embodiments of the present disclosure.

The drawings are not necessarily to scale. The drawings are merely representations, not intended to portray specific parameters of the disclosure. Furthermore, the drawings are intended to depict exemplary embodiments of the disclosure, and therefore is not considered as limiting in scope.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present disclosure will now proceed with reference to the accompanying drawings, in which various approaches are shown. It will be appreciated, however, that the switch and switch assembly may be embodied in many different forms and should not be construed as limited to the approaches set forth herein. Rather, these approaches are provided so that this disclosure will be thorough and complete, and will fully convey the scope of the disclosure to those skilled in the art. In the drawings, like numbers refer to like elements throughout.

As used herein, an element or operation recited in the singular and proceeded with the word "a" or "an" should be understood as not excluding plural elements or operations, unless such exclusion is explicitly recited. Furthermore, references to "one approach" or "one embodiment" of the present disclosure are not intended to be interpreted as excluding the existence of additional approaches and embodiments that also incorporate the recited features.

Furthermore, spatially relative terms, such as "beneath," "below," "lower," "central," "above," "upper," "proximal," "distal," and the like, may be used herein for ease of describing one element's relationship to another element(s) as illustrated in the figures. It will be understood that the spatially relative terms may encompass different orientations of the device in use or operation in addition to the orientation depicted in the figures.

As disclosed, embodiments herein provide switch assemblies and switching methods. The embodiments disclosed herein are designed as an improvement over existing electroplated contact systems in which reed blades are coated with successive layers of titanium, copper, titanium, molybdenum, and ruthenium. In order to improve upon the performance and cost shortcomings of the prior art, embodiments herein provide a sputtered material contact apparatus including successive layers of titanium, copper and tungsten-copper. In some non-limiting examples, the concentration of copper in the tungsten-copper material may range from 0 to 30 weight percent.

It has been found that the embodiments herein provide at least the following technical advantages/improvements over the existing art. Firstly, the sputtered tungsten-copper, copper, titanium (W—Cu/Cu/Ti) contact material layering on the reed switches exhibits superior electrical performance compared to sputtered ruthenium, molybdenum, titanium, copper, and titanium contact material. Secondly, the sputtered W—Cu/Cu/Ti contact material on reed switches exhibits superior electrical performance at, for example, 33V-3 A, 120V-1 A and 400V-0.002 A, as compared to plated ruthenium, rhodium, and gold contact material. Thirdly, in the case thermal treatments are performed, a post sputter thermal treatment has been found to significantly increase electrical performance at, for example, 400V-0.002 A.

Figure 2:
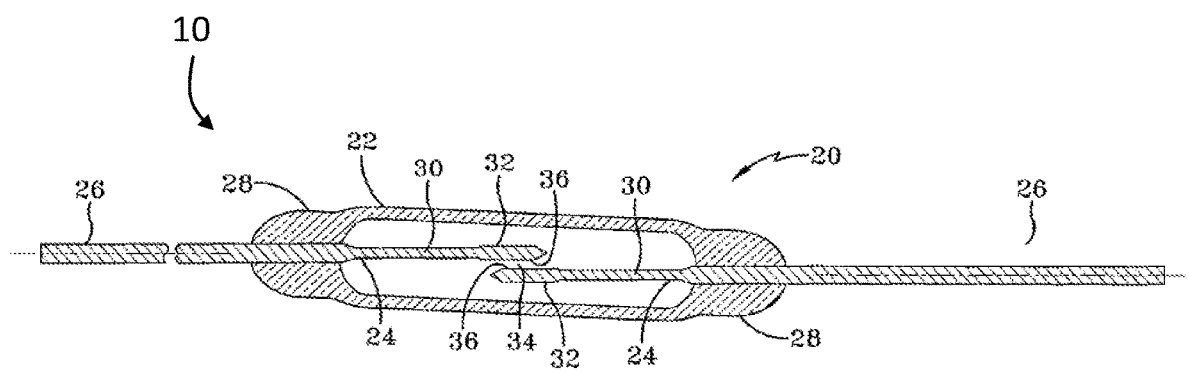
FIG. 2 is a cross-sectional view of the reed switch of FIG. 1, taken along section line 2-2, according to embodiments of the present disclosure.

Referring now to FIGS. 1-2, a switch assembly (hereinafter "assembly") 10 according to embodiments of the disclosure will be described. As shown, the assembly 10 may include a reed switch 20. Although non-limiting, the reed switch 20 is of the so-called "Form A" type having an axially extending cylindrical glass capsule 22. First and second reed blades 24 (hereinafter "reed blades 24") extend into a hermetically sealed volume defined by the glass capsule 22. Each reed blade 24 has a lead 26 that extends through opposed axial ends 28 of the glass capsule 22. The opposed ends 28 of the glass capsule may be heated and fused to the lead 26 of each reed blade 24, thus positioning the reed blades with respect to each other and forming a hermetic seal and enclosing the capsule volume. The capsule volume typically contains either a vacuum or an inert gas such as nitrogen or argon, sometimes at above atmospheric pressures.

Although non-limiting, a portion 30 of each reed blade 24 may be flattened, producing a controlled spring constant which controls the force required to close the reed switch 20. The reed blades 24 terminate in respective first and second contacts 32 (hereinafter "contacts 32"). The contacts 32 of the reed blades 24 overlap, defining a contact space or gap 34 therebetween. Each contact 32 may have a contact surface 36. The contact surfaces 36 face each other across the contact gap 34.

The reed switch blades 24 may be formed of a ferromagnetic alloy, typically an alloy of nickel and iron having a composition of, for example, 51-52 percent nickel. In the presence of a magnetic field, such as generated by an electrical coil or a permanent magnet, the magnetic field permeates the reed blades 24, causing the reed blades to attract one another. The attraction force causes flexure of the flexible portions 30 of the reed switch blades 24 so that the contacts 32 close the contact gap 34, thus bringing the contact surfaces 36 into engagement and completing an electrical circuit between the leads 26. When the magnetic field is removed, a magnetic field no longer permeates the reed blades 24 and the contacts 32 separate, reestablishing the contact gap 34, and breaking the electrical circuit between the leads 26.

In some embodiments, the reed switch 20 can switch a load of between 10 and 100 Watts or more, at voltages up to or exceeding 500 volts DC. When the reed switch 20 is under load, an electric arc can form between the contact surfaces 36 upon opening or closing of the reed switch 20. Furthermore, mechanical wear can occur between the contact surfaces 36 during repeated opening and closing of the reed switch 20. As reed switches are normally designed with lifetimes of 1 million to 100 million operations or more over the lifetime of the reed switch, it is desirable that the contact resistance does not substantially increase, e.g., does not increase by more than 50 percent.

Figure 3:
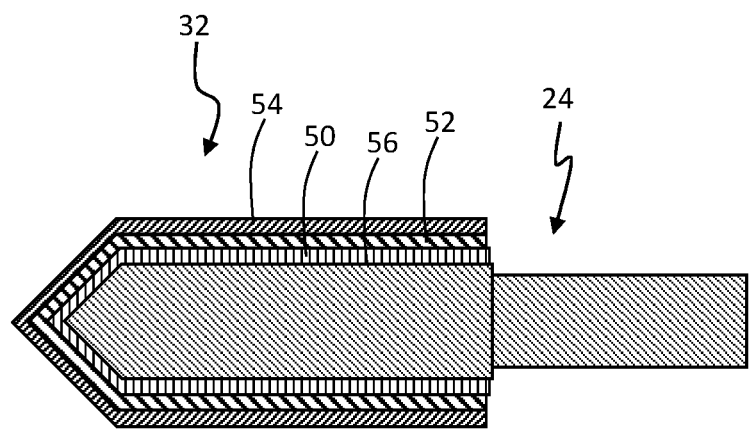
FIG. 3 is side cross-sectional view of one contact of the reed switch of FIG. 1, taken along section line 3-3, according to embodiments of the present disclosure.

As shown in FIG. 3, to prevent an increase in contact resistance, the contact 32 of each reed blade 24 may be coated, e.g., by sputtering, with a plurality of layers. For example, a base conductive layer 50 (hereinafter "first layer 50") may be made of titanium, a second conductive layer 52 (hereinafter "second layer 52") may be made of copper, and a tungsten-copper layer 54 (hereinafter "third layer 54) may be made of tungsten-copper. In some embodiments, the second layer 52 may be made from molybdenum. During formation, the first layer 50 may be sputtered over an outer surface 56 of the contact 32, and the second layer 52 may be sputtered over the first layer 50. Next, the third layer 54 may be sputtered over the second layer 52.

After formation of the first, second, and third layers 50, 52, and 54, the reed blade 24 may be thermally treated. A thermal treatment following the sputtering of the first, second, and third layers 50, 52, and 54 may extend the number of cycles before failure. For example, at 400V, 0.002 A, the average life before failure for prior art plated switches is approximately 6.5 million cycles. For sputtered prior art devices including a coating of Ru/Mo/Ti/Cu/Ti, the average life before failure is approximately 5.5 million cycles. However when the sputtered layers of W—Cu/Cu/Ti of the present disclosure are thermally treated following formation, failure may not occur until beyond at least 16.4 million cycles.

Although non-limiting, the thickness of the three layers can range, for example, from about 15 micro-inches to about 150 micro-inches for each of the titanium and the copper/molybdenum layers, and between about 5 micro-inches and 75 micro-inches for the tungsten-copper. When replacing the contact coating arrangement in existing reed switch designs, the total thickness of the first, second, and third layers 50, 52, 54 can be selected to have the same total thickness as the original contact coating. In this way, the design of the reed switch itself need not be modified.

Figure 4:
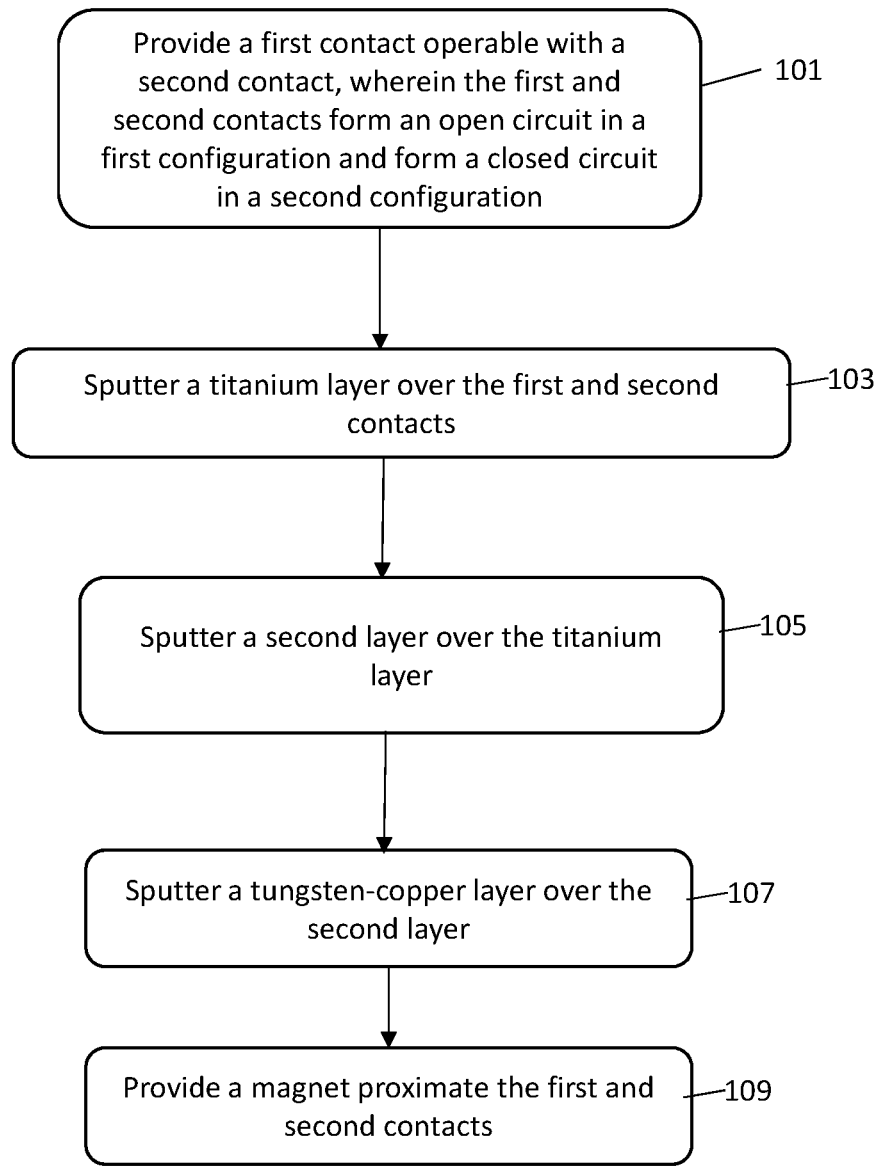
FIG. 4 is a flow chart of a switching method according to embodiments of the present disclosure.

Turning now to FIG. 4, a method 100 for operating the assembly 10 according to embodiments of the present disclosure will be described in greater detail. At block 101, the method 100 may include providing a first contact operable with a second contact, wherein the first and second contacts form an open circuit in a first configuration and form a closed circuit in a second configuration. In non-limiting embodiments, the first and second contacts may be normally open or normally closed. In yet other embodiments, the switch assembly may have three leads, combining normally closed and normally open circuits.

At block 103, the method 100 may include sputtering a titanium layer over the first and second contacts. At block 105, the method 100 may include sputtering a second layer over the titanium layer. In some embodiments, the second layer may be a layer of copper or molybdenum. At block 107, the method 100 may include sputtering a tungsten-copper layer over the second layer. In some embodiments, the first and second contacts may then be thermally treated. At block 109, the method 100 may optionally include providing a magnet proximate the first and second contacts. The magnet causes the first and second contacts to change between the first configuration and the second configuration in response to movement of the magnet. In some embodiments, the method 100 may then include providing an indication of the open circuit or closed circuit between the first and second contacts.

While the present disclosure has been described with reference to certain approaches, numerous modifications, alterations and changes to the described approaches are possible without departing from the sphere and scope of the present disclosure, as defined in the appended claims. Accordingly, it is intended that the present disclosure not be limited to the described approaches, but that it has the full scope defined by the language of the following claims, and equivalents thereof. While the disclosure has been described with reference to certain approaches, numerous modifications, alterations and changes to the described approaches are possible without departing from the spirit and scope of the disclosure, as defined in the appended claims. Accordingly, it is intended that the present disclosure not be limited to the described approaches, but that it has the full scope defined by the language of the following claims, and equivalents thereof.

What is claimed is:

1. A switch assembly comprising:
    a first blade having a first contact within an enclosed cavity;
    a second blade having a second contact within the enclosed cavity, the first and second contacts operable to make or break contact with one another in response to a magnetic field; and
    a coating formed over each of the first and second contacts, the coating comprising:
        a base conductive layer;
        a second conductive layer formed over the base conductive layer; and
        a tungsten-copper layer formed over the second conductive layer.

2. The switch assembly of claim 1, wherein the second conductive layer is one of: copper, and molybdenum.

3. The switch assembly of claim 1, wherein the base conductive layer, the second conductive layer, and the tungsten-copper layer are each sputtered layers.

4. The switch assembly of claim 1, wherein the tungsten-copper layer of the first contact is operable to make contact with the tungsten-copper layer of the second contact.

5. A reed switch, comprising:
    a first blade having a first contact within an enclosed cavity;
    a second blade having a second contact within the enclosed cavity, the first and second contacts operable to make or break contact with one another in response to a magnetic field; and
    a coating formed over each of the first and second contacts, the coating comprising:
    a base conductive layer;
        a second conductive layer formed over the base conductive layer; and
        a tungsten-copper layer formed over the second conductive layer.

6. The reed switch of claim 5, wherein the second conductive layer is one of:
    copper, and molybdenum.

7. The reed switch claim 5, wherein the base conductive layer, the second conductive layer, and the tungsten-copper layer are each sputtered layers.

8. The reed switch of claim 5, wherein the tungsten-copper layer of the first contact is operable to make contact with the tungsten-copper layer of the second contact.

9. The reed switch of claim 5, wherein the tungsten-copper layer of the first contact is operable to make contact with the tungsten-copper layer of the second contact in response to movement of a magnet.

10. The reed switch of claim 5, wherein tungsten-copper layer of the first contact is operable to break contact with the tungsten-copper layer of the second contact.

* * * * *